United States Patent
Kim et al.

(10) Patent No.: US 10,283,390 B2
(45) Date of Patent: May 7, 2019

(54) APPARATUS FOR PROCESSING SUBSTRATE

(71) Applicant: Semes Co., Ltd., Cheonan-si, Chungcheongnam-do (KR)

(72) Inventors: Daehun Kim, Cheonan-si (KR); Gui Su Park, Asan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 316 days.

(21) Appl. No.: 15/167,414

(22) Filed: May 27, 2016

(65) Prior Publication Data
US 2016/0351430 A1    Dec. 1, 2016

(30) Foreign Application Priority Data

May 29, 2015  (KR) .................. 10-2015-0076510

(51) Int. Cl.
   *H01L 21/677*   (2006.01)
   *H01L 21/67*    (2006.01)

(52) U.S. Cl.
   CPC .. *H01L 21/67196* (2013.01); *H01L 21/67173* (2013.01); *H01L 21/67178* (2013.01); *H01L 21/67742* (2013.01)

(58) Field of Classification Search
   CPC .............................................. H01L 21/67766
   See application file for complete search history.

(56) References Cited

U.S. PATENT DOCUMENTS

| 4,951,601 A * | 8/1990 | Maydan ........... H01L 21/67167 118/715 |
| 5,254,170 A * | 10/1993 | Devilbiss ........... F27B 17/0025 118/719 |
| 2002/0182759 A1* | 12/2002 | Yamagata .............. G01R 31/27 438/11 |
| 2010/0192844 A1* | 8/2010 | Kim .................... G03F 7/70341 118/69 |
| 2011/0135428 A1* | 6/2011 | Kim .................. H01L 21/67781 414/222.07 |

(Continued)

FOREIGN PATENT DOCUMENTS

| CN | 1674220 A | 9/2005 |
| CN | 1805126 | 7/2006 |

(Continued)

*Primary Examiner* — Joseph A Miller, Jr.
(74) *Attorney, Agent, or Firm* — Harness, Dickey & Pierce, P.L.C.

(57) ABSTRACT

An apparatus for processing a substrate includes a load port on that a substrate transfer container accommodating a substrate is laid, a processing part configured to process a substrate, and an index part including an index robot configured to carry a substrate between the substrate transfer container and the processing part, wherein the processing part includes a first transfer chamber configured to have a first main carrying robot carrying a substrate and disposed adjacent to the index part, a second transfer chamber configured to have a second main carrying robot carrying a substrate and disposed adjacent to the first transfer chamber, and a shuttle buffer part configured to move between the first transfer chamber and the second transfer chamber for transferring a substrate between the second main carrying robot and the index robot.

10 Claims, 5 Drawing Sheets

(56) References Cited

U.S. PATENT DOCUMENTS

2013/0026135 A1* 1/2013 Kim ................ H01L 21/67109
216/58
2014/0072397 A1* 3/2014 Mooring ................ H01L 21/00
414/805

FOREIGN PATENT DOCUMENTS

| | | | |
|---|---|---|---|
| CN | 1975996 | A | 6/2007 |
| CN | 101625963 | A | 1/2010 |
| CN | 101656201 | A | 2/2010 |
| CN | 101842890 | A | 9/2010 |
| CN | 102037551 | A | 4/2011 |
| CN | 102132393 | | 7/2011 |
| CN | 102160168 | A | 8/2011 |
| CN | 103681419 | | 3/2014 |
| KR | 20100011852 | A | 2/2010 |
| KR | 20130020203 | A | 2/2013 |

* cited by examiner

APPARATUS FOR PROCESSING SUBSTRATE

CROSS-REFERENCE TO RELATED APPLICATIONS

A claim for priority under 35 U.S.C. § 119 is made to Korean Patent Application No. 10-2015-0076510 filed May 29, 2015, in the Korean Intellectual Property Office, the entire contents of which are hereby incorporated by reference.

BACKGROUND

Embodiments of the inventive concept described herein relate to an apparatus for processing a substrate, and more particularly, relate to an apparatus for cleaning a substrate.

In a general process for manufacturing a substrate, the unit processing steps of depositing, etching, photoresist-coating, developing, and asher-removing are repeated in many times to form arrangements of microscopic patterns. After the process, remnants incompletely removed by an etching or asher-removing step may be existed in substrates. A process for removing such remnants is a wet cleaning process using deionized water or chemicals.

In a substrate cleaning apparatus, chemicals or deionized water are supplied to a substrate, which is being rotated by a motor after fixed to a chuck in a small chamber which is capable of processing a sheet of substrate, through nozzles placed over the substrate. Then chemicals or deionized water spread out on a substrate by rotation of the substrate and thereby remnants attached to the substrate are removed therefrom.

FIG. 1 illustrates an arrangement structure of a general substrate cleaning apparatus 1000, including a loading/unloading part 1100, an indexing robot 1200, a buffer part 1300, a processing chamber 1400, and a main transfer robot 1500 from one side therein. The index robot 1200 transfers a substrate between the buffer part 1300 and the loading/unloading part 1100, and the main transfer robot 1500 transfers a substrate between the buffer part 1300 and the processing chamber 1400.

In the substrate cleaning apparatus 1000, as one member of the main transfer robot 1500 is used to carry a substrate in and out of a multiplicity of processing chambers 1400, a tact time for transferring the substrate increases as a moving distance of the main transfer robot 1500 becomes longer.

To increase an amount of products from the substrate cleaning apparatus 1000, there has been proposed a method of increasing the number of hands and buffer slots of the index robot 1200 and the main transfer robot 1500. However, even the proposed method has still a limit in the case that there is a need of product amount equal to or larger than 500 sheets.

In the meantime, as shown in FIG. 2, in the case of disposing the main transfer robot 1500 in two members for increasing a product amount, there is a problem of enlarging a width (L) of the apparatus from 2230 to 2800 mm.

SUMMARY

Embodiments of the inventive concept provide an apparatus for processing a substrate for shortening a tact time.

Embodiments of the inventive concept provide an apparatus for processing a substrate for maximizing a throughput thereof.

Subjects to be solved by the embodiments of the inventive concept may not be restrictive hereto and other subjects undefined herein may be clearly construed from the following description by ordinary artisans in the art.

One aspect of embodiments of the inventive concept is directed to provide an apparatus for processing a substrate. The apparatus may include a load port on that a substrate transfer container accommodating a substrate is laid, a processing part configured to process the substrate; and an index part including an index robot configured to carry the substrate between the substrate transfer container and the processing part, wherein the processing part may include a first transfer chamber configured to have a first main carrying robot carrying a substrate and disposed adjacent to the index part, a second transfer chamber configured to have a second main carrying robot carrying a substrate and disposed adjacent to the first transfer chamber; and a shuttle buffer part configured to move between the first transfer chamber and the second transfer chamber for transferring a substrate between the second main carrying robot and the index robot.

Additionally, the shuttle buffer part may include two shuttle buffers configured to move independently, wherein one of the two shuttle buffers may be configured to carry substrates to the second main carrying robot before processing and the other of the two shuttle buffers may be configured to carry substrates to the index robot after processing.

Additionally, the shuttle buffer part may further include a moving axis which may be configured to allow the shuttle buffer to be moved and configured to extend from the first transfer chamber to the second transfer chamber.

Additionally, the apparatus may further include a shirking control part configured to move the first main carrying robot out of a transfer path of the shuttle buffer part to prevent collision with the first main carrying robot while the shuttle buffer part is moving.

Additionally, the processing part may include a first chamber part, in which at least two or more processing chambers are stacked, disposed around the first transfer chamber, and a second chamber part, in which at least two or more processing chambers are stacked, disposed around the second transfer chamber.

Additionally, the index chamber, the first transfer chamber, and the second transfer chamber may be arranged in a first direction, the first chamber part may be symmetrical to a side of the first transfer chamber in a second direction that is different from the first direction, and the second chamber part may be symmetrical to a side of the second transfer chamber in a second direction that is different from the first direction.

Another aspect of embodiments of the inventive concept is directed to provide an apparatus for processing a substrate, including a first processing part, a second processing part disposed at the back of the first processing part, an index part disposed at the front of the first processing part and configured to have an index robot, and a shuttle buffer configured to directly carry a substrate, which is to be processed in the second processing part, from the index part and to directly carry a substrate, which is processed in the second processing part, to the index part.

Still another aspect of embodiments of the inventive concept is directed to provide an apparatus for processing a substrate, including an index part configured to have an index robot, a fixed buffer in contact with the index part, a first processing part, in which a processing chamber is disposed around a first main carrying robot, connected with the fixed buffer, a second processing part, in which a processing chamber is disposed around a second main carrying robot, disposed adjacent to the first processing part, and a shuttle buffer configured to transfer a substrate between the second main carrying robot and the index part.

Additionally, the shuttle buffer may be configured to move between a first position, to which the second main carrying robot is approachable, and a second position to that the index robot is approachable.

Additionally, the apparatus may further include a shirking control part configured to move the first main carrying robot out of a transfer path of the shuttle buffer part to prevent collision with the first main carrying robot while the shuttle buffer part is moving.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
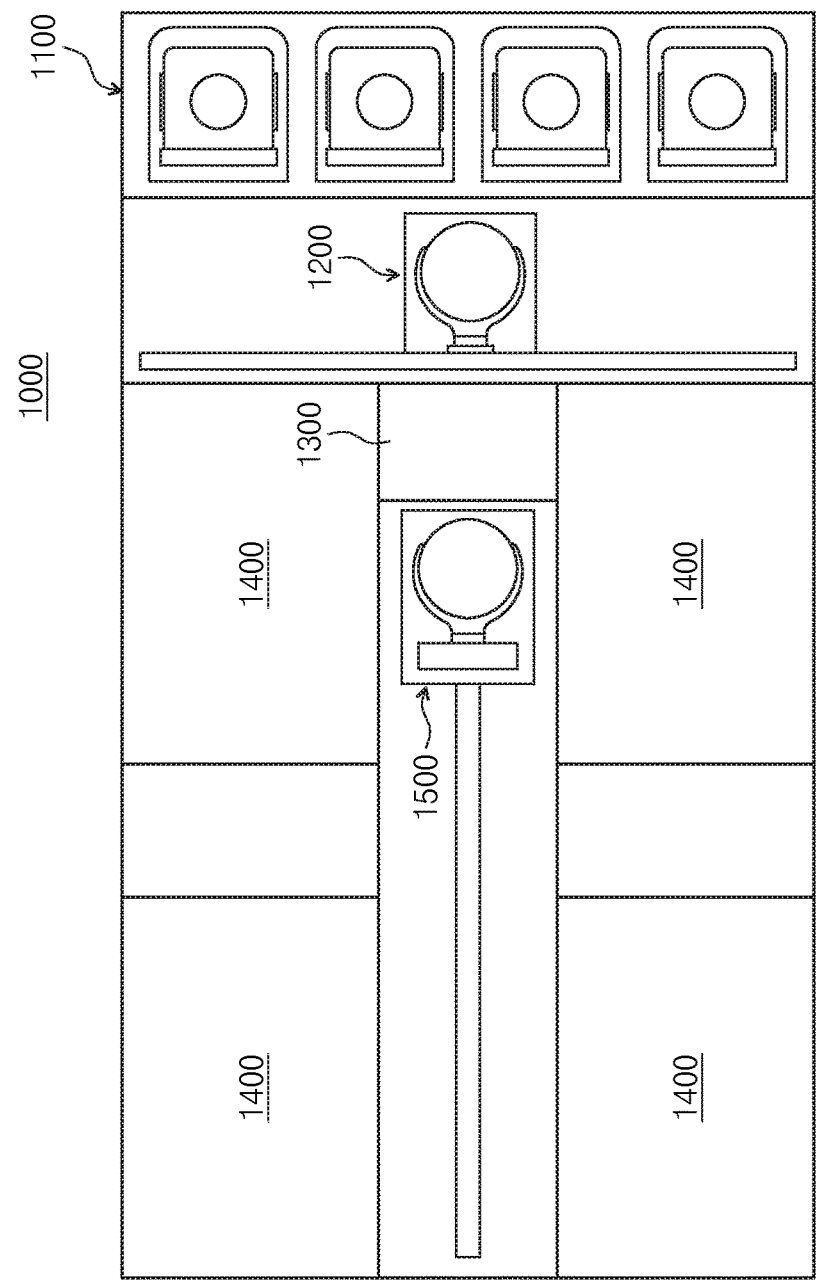
FIGS. 1 and 2 illustrate general arrangement structures.
Figure 2:
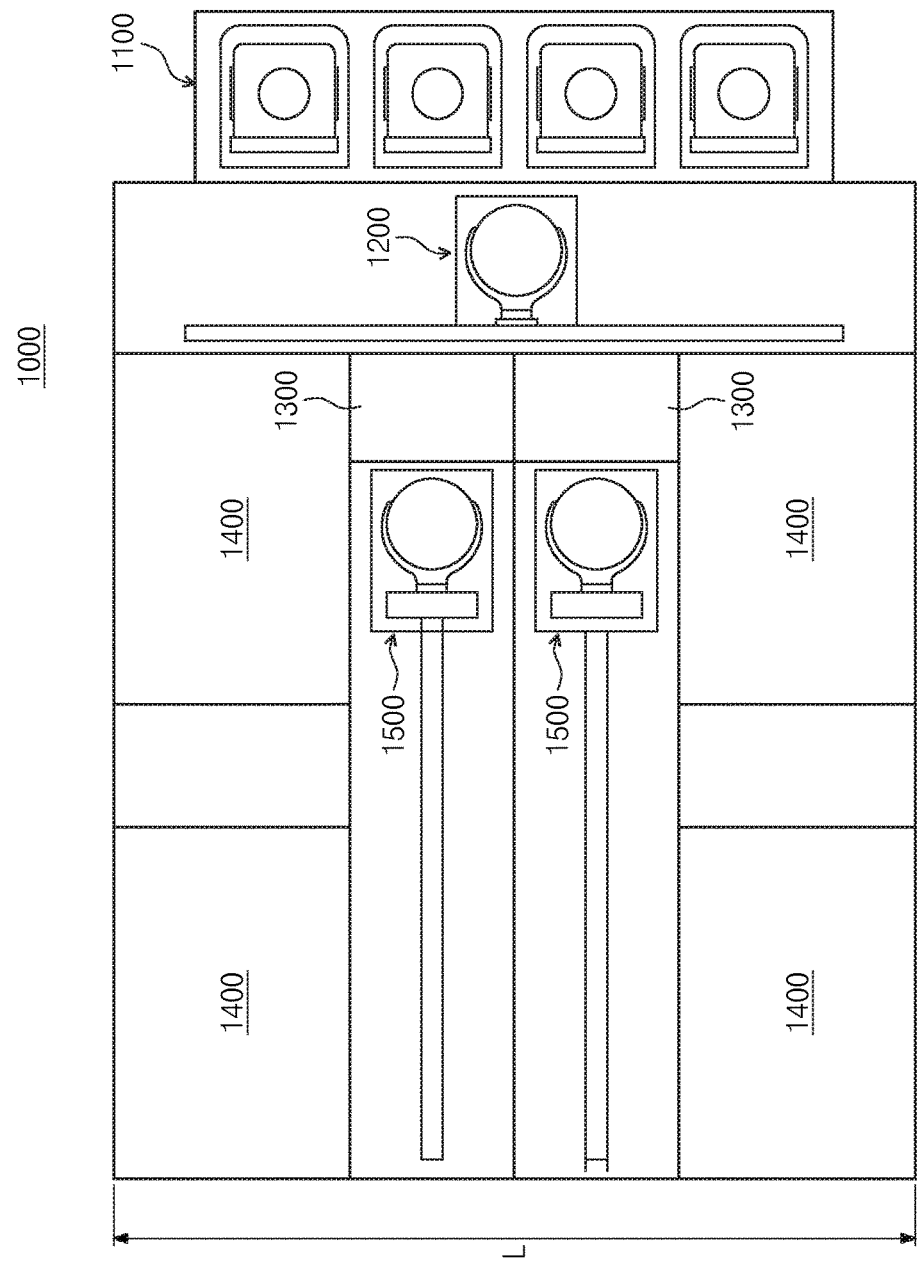

Hereinafter, various embodiments of the present disclosure will be described in conjunction with the accompanied figures. Various embodiments described herein, however, may not be intentionally confined in specific embodiments, but should be construed as including diverse modifications, equivalents, modifications, and/or alternatives. In describing embodiments of the inventive concept, descriptions which would stagger the understanding of the inventive concept will be excluded herefrom.

The terms used in this specification are just used to describe various embodiments of the present disclosure and may not be intended to limit the scope of the present disclosure. The terms of a singular form may also include plural forms unless otherwise specified. The terms 'include' or 'have', as used herein, may be construed such that any one of a feature, a number, an operation, a step, an element, a component and/or a combination of them does not exclude presence or addition of one or more different features, numbers, operations, steps, elements, components and/or combinations of them.

The terms 'first', 'second', and so on may be used for indicating various elements but may not be used for restricting the elements. The terms may be used merely for differentiating one element from other elements.

Now embodiments of the inventive concept will be described in conjunction with the accompanied figures. Like reference numerals will indicate like elements throughout the figures and the same element regardless of the same or corresponding numeral will not be described in duplication.

The following embodiments will be described with a semiconductor wafer as an example of substrate. However, a substrate may be variable in a type of photomask, flat display panel, or another one besides a semiconductor wafer. Additionally, the embodiments will be exemplified as a substrate processing apparatus is an apparatus for cleaning substrates.

Figure 3:
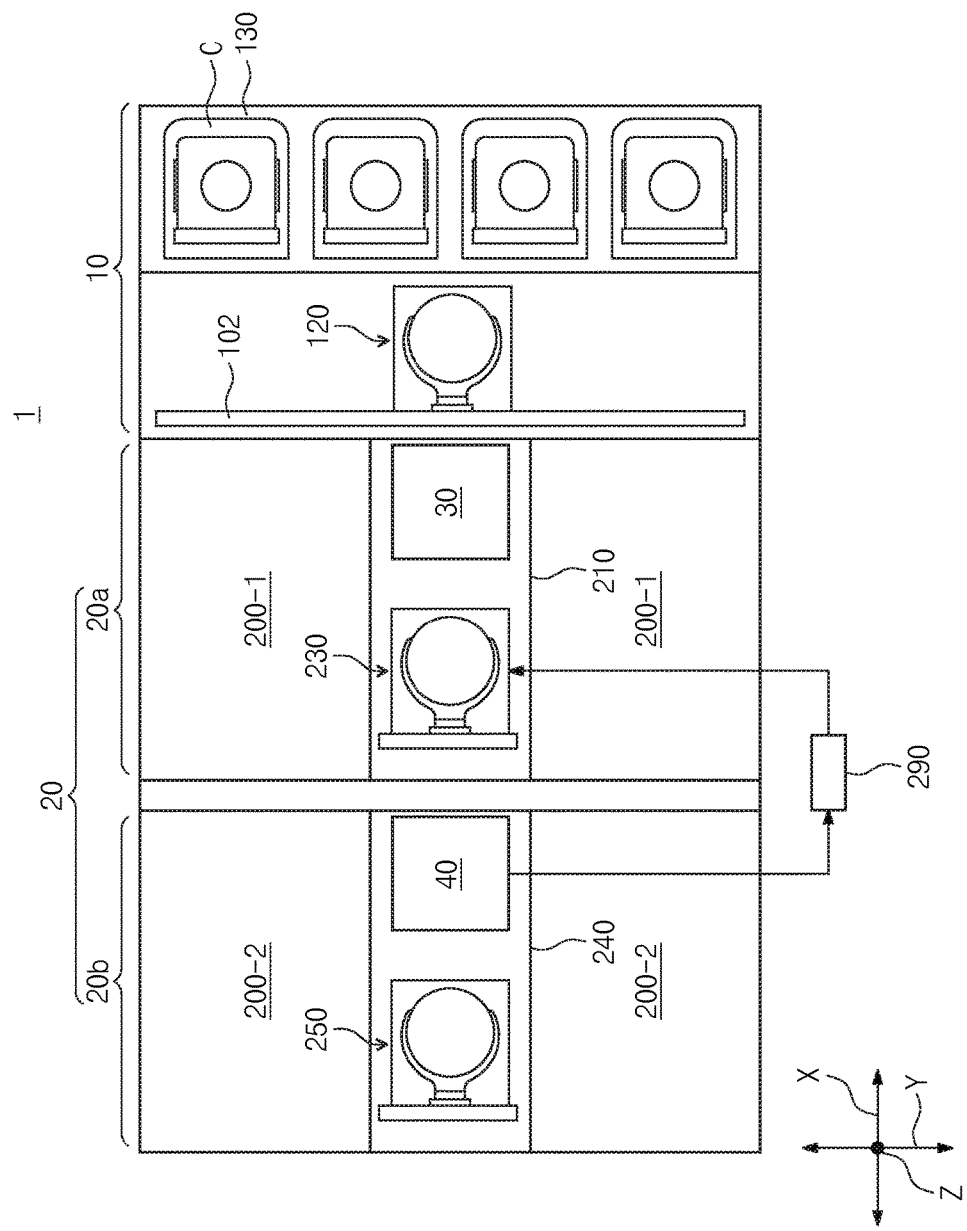
FIG. 3 is a plan view illustrating a configuration of a substrate processing apparatus according to an embodiment of the inventive concept.

Referring to FIG. 3, a substrate processing apparatus 1 according to the inventive concept may include an index part 10 and a processing part 20.

The index part 10 and the processing part 20 may be arranged in a line. Hereafter, a direction along which the index part 10 and the processing part 20 are arranged will be referred to as 'first direction X', and the direction orthogonal to the first direction in view from the top will be referred to as 'second direction Y'. The direction vertical to a plane including the first direction X and the second direction Y will be 'third direction Z'.

The index part 10 may be disposed at a front side of the substrate processing apparatus in the first direction X. The index part 10 may be an interface which is hereafter called Equipment Front End Module (EFEM) normally used as a 300-mm wafer carrying device in recent years. The index part 10 may include an index chamber 100, a load port 130 where a carrier 11 in which substrates are stacked is settled, and an index robot 210 operating under normal pressure. The load port 130 may open and close the cover of the carrier.

The load port 130 may be provided in plurality. A plurality of load ports 130 may be arranged in a line along the second direction Y. The number of the load ports 130 may even increase or decrease in accordance with conditions of footprints and processing efficiency of the substrate processing apparatus 1. The carrier 11 accommodating substrates W may be settled in the load port 130. The index part 10 may carry out substrates which are still not processed, or carry in substrates, which are processed, in the condition that the carriers 11 are being loaded into the load ports 130.

The carrier 11 may be used with a Front Opening Unified Pod (FOUP). In the carrier 11, a multiplicity of slots may be formed to accommodate substrates in horizontal to the ground surface.

The index chamber 100 may be disposed adjacent to the load port 130 in the first direction X. The index chamber 100 may be disposed between the load port 130 and the first processing part 20a. The index chamber 100 may include an indexing rail 102 and an index robot 120. The index robot 120 may be settled on the indexing rail 102.

The index robot 120 may operate to carry a substrate between the rod port 130 and the processing part 20. The index robot 120 may be formed of a robot with an arm structure which carries out at least one or more substrates in one-time operation from the carrier 11, which is laid in the load port 130, and then carries the substrates into a fixed buffer or shuttle buffer. The index robot 120 installed in the index chamber 100 may be used with variable types of robots, which are available in general processes of semiconductor fabrication, in addition to the structure with a plurality of arms shown by embodiments of the inventive concept. For example, it may be permissible to employ a robot which is equipped with double-blade arms handling two substrates by one arm, a one-arm robot, or a hybrid robot adopting them.

The processing part 20 may be disposed adjacent to the index part 10 at a rearside of the substrate processing apparatus 1 along the first direction X. The processing part 20 may include a second processing part 20b, a fixed buffer 30, and a shuttle buffer part 40 in addition to the first processing part 20a.

Figure 4:
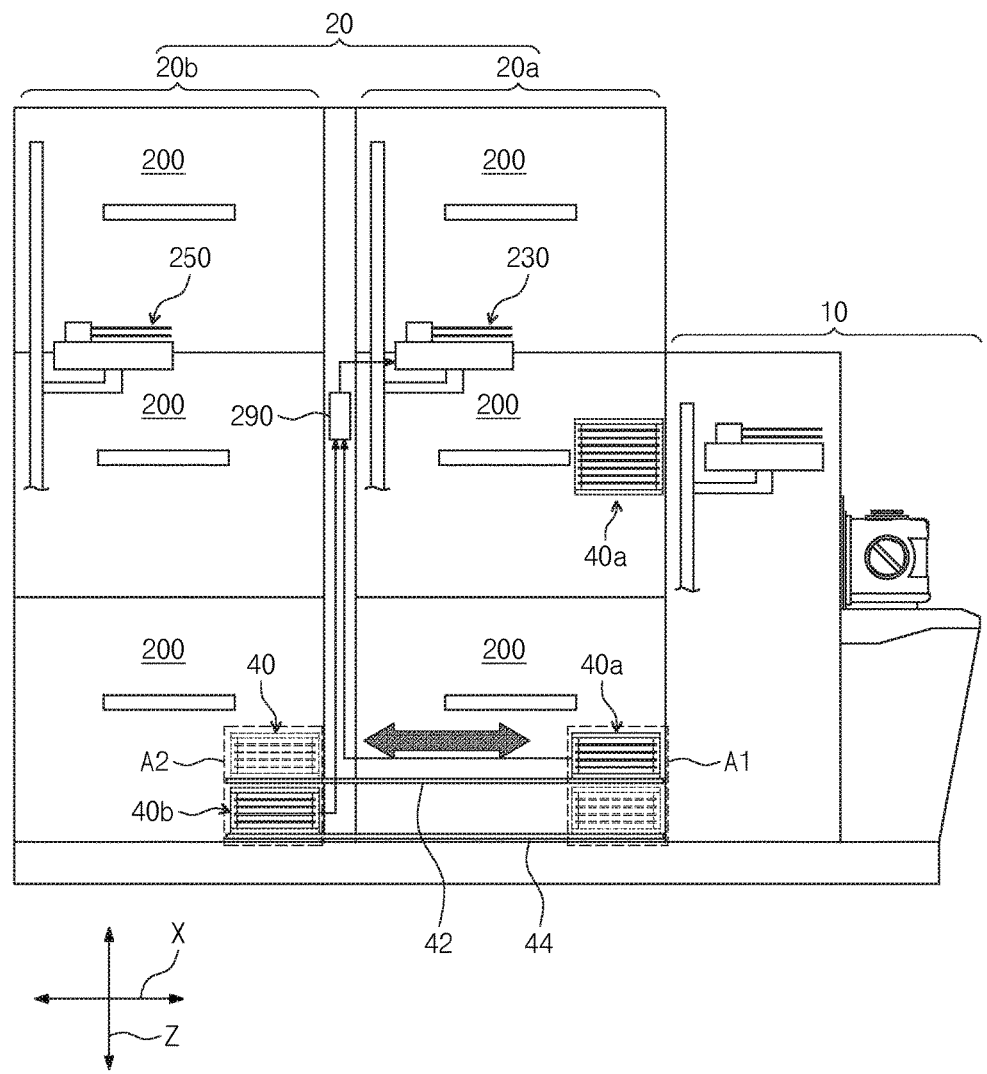
FIG. 4 is a side view illustrating the substrate processing apparatus of FIG. 3.
Figure 5:
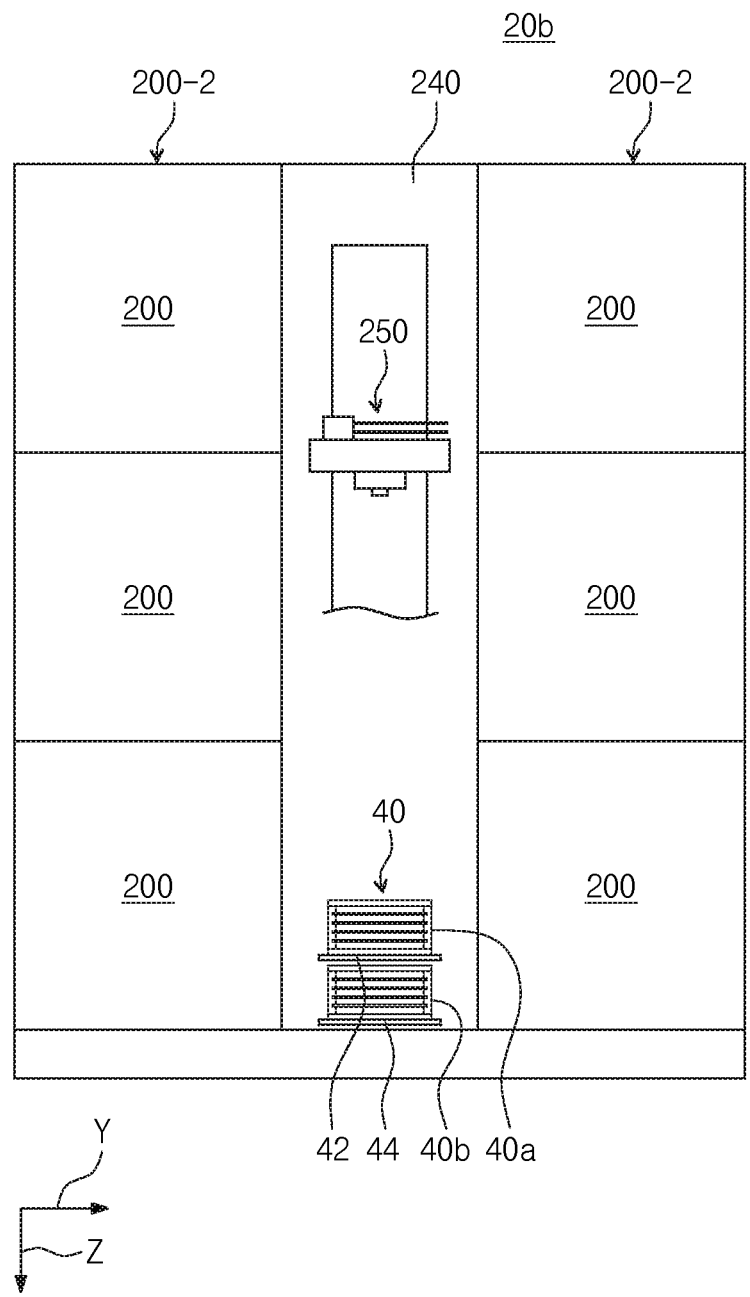
FIG. 5 illustrates a second processing part.

FIG. 4 is a side view illustrating the substrate processing apparatus of FIG. 3, and FIG. 5 illustrates a second processing part.

Referring to FIGS. 3 to 5, a first processing part 20a may be disposed adjacent to the index chamber 130 in the first direction X. The second processing part 20b may be disposed at the back of the first processing part 20a.

The first processing part 20a may include a first transfer chamber 210 where a first main carrying robot 230 is placed, and first chamber parts 200-1 disposed around the first transfer chamber 210. The first chamber part 200-1 may include processing chambers 200 which are stacked in the third direction Z. in this embodiment, three processing chambers 200 are stacked to allow the first processing part 20a to be equipped totally with six processing chambers 200 in the around area to which the first main carrying robot 230 is approachable.

The first main carrying robot 230 may not have a moving axis but may have a structure which is elevated and rotated on the axis in the third direction Z. As such, the first processing part 20a may be equipped with three processing chambers 200 at its opposite sides to which the first main carrying robot 230 is approachable. And the first main carrying robot 230 may not be needed to move. Accordingly, a tact time for transferring substrates may be remarkably reduced to improve a product amount.

Substrates to be processed in the first processing part 20a may stand at the fixed buffer 30 and substrates processed in the first processing part 20a may temporarily stand at the fixed buffer 30. The fixed buffer 30 may be disposed at the front of the processing part 20 along the first direction X. In more detail, the fixed buffer 30 may be disposed between the first main carrying robot 230 and the index robot 120. The fixed buffer 30 may correspond to a standby place which temporarily accommodates the substrate W before being carried between the first processing part 20a and the carrier 11. The fixed buffer 30 may include a slot in which the substrate W is accommodated. The slot may be provided in plurality with isolation each other along the third direction Z.

The second processing part 20b may be disposed adjacent to the first processing part 20a in the first direction X.

The second processing part 20b may include a second transfer chamber 240 where a second main carrying robot 250 is placed, and a second chamber part 200-2 disposed around the second transfer chamber 240. The second chamber part 200-2 may include the processing chambers 200 which are stacked in the third direction Z. in this embodiment, three processing chambers 200 may be stacked to allow the second processing part 20b to be equipped totally with six processing chambers 200 in the around area to which the second main carrying robot 250 is approachable.

The second main carrying robot 250 may not have a moving axis, like the first main carrying robot 230, but may be elevated and rotated on the axis in the third direction Z.

As such, the second processing part 20b may be equipped with three processing chambers 200 at its opposite sides to which the second main carrying robot 250 is approachable. And the second main carrying robot 250 may not be needed to move. Accordingly, a tact time for transferring substrates may be remarkably reduced to improve a product amount.

The shuttle buffer part 40 may be disposed a lower space of the processing part and may include two shuttle buffers 40a and 40b which move independently. Substrates to be processed in the second processing part 20b may be stacked in the first shuttle buffer 40a, and substrates to be processed in the second processing part 20b may be stacked in the second shuttle buffer 40b.

As an example, the first shuttle buffer 40a, in which substrates before a process are to be loaded, and a second shuttle buffer 40b, in which substrates after a process are to be loaded, may be provided to move between a first position (A1 of FIG. 4), to which the index robot 120 is approachable, and a second position (A2 of FIG. 4) to which the second carrying robot is approachable. For this operation, the processing part 20 may be provided with a shuttle moving roads 42 and 44 which extend from the first processing part 20a to the second processing part 20b.

Although this embodiment is illustrated as the shuttle buffer part 40 is disposed in a lower space of the processing part 20, the shuttle buffer part 40 may be disposed in an upper space, not in the lower space, of the processing part 20. Although not shown, a driving part for moving the shuttle buffers 40a and 40b may be provided to additional spaces which are comparted independently from the processing part for the purpose of managing particles in the processing part.

Substrates to be processed in the second processing part 20b may stay at the fixed buffer 30 and substrates processed in the first processing part 20a may temporarily stand at the fixed buffer 30. The fixed buffer 30 may be disposed at the front of the processing part 20 along the first direction X. In more detail, the fixed buffer 30 may be disposed between the first main carrying robot 230 and the index robot 120. The fixed buffer 30 may correspond to a standby place which temporarily accommodates the substrate W before the substrate W is carried between the first processing part 20a and the carrier 11. The fixed buffer 30 may include a slot in which the substrate W is accommodated. The slot may be provided in plurality with isolation each other along the third direction Z.

In the meantime, the substrate processing apparatus 1 may include a shirking control part 290 to move the first main carrying robot 230 out of transfer paths of the first shuttle buffer 40a and the second shuttle buffer 40b for the purpose of preventing collision or interference with the first main carrying robot 230 while the first shuttle buffer 40a and the second shuttle buffer 40b are moving. As an example, the shirking control part 290 may be preliminarily provided with moving signals of the first shuttle buffer 40a and the second shuttle buffer 40b and then may control the first main carrying robot 230 to move evadingly.

As such, substrates processed in the second processing part 20b may be stored in the second shuttle buffer 40b through the second main carrying robot 250. The second shuttle buffer 40b may convey the processed substrates to the index robot 120 regardless of an operation of the second main carrying robot 250, thereby reducing a tact time of the second main carrying robot 250.

According to embodiments of the inventive concept, it may be effective to allow an arrangement with 12 chambers in total, which is more by 4 chambers than before, without increasing a width of a substrate processing apparatus.

According to embodiments of the inventive concept, by quickly transferring substrates between a buffer part and processing chambers only through elevation and rotation (directional turn) of a main carrying robot, it may be allowable to remarkably reduce a tact time for transferring the substrates, thus increasing the efficiency of processing the substrates.

According to embodiments of the inventive concept, by linearly arranging two processing parts, which have main carrying robots, in a substrate processing apparatus whose area does not increase from the general one and by transferring a substrate, which is completely processed from a processing part far from an index part, through a shuttle buffer, it may be allowable to minimize an amount of hands of a carrying robot and to improve a throughput that would be reduced due to a decrease of a tact time.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus configured to process a substrate, the apparatus comprising:
    a load port configured to hold a substrate transfer container accommodating the substrate;
    an index part including an index robot configured to transfer the substrate from the substrate transfer container;
    a processing part configured to receive the substrate from the indexing robot, and to process the substrate, the processing part including,
        a first transfer chamber adjacent to the index part, the first transfer chamber including a first main carrying robot configured to rotate to carry the substrate, and
        a second transfer chamber adjacent to the first transfer chamber such that the index part, the first transfer chamber and the second transfer chamber are sequentially arranged in a first direction with the first transfer chamber between the index part and the second transfer chamber, the second transfer chamber including a second main carrying robot configured to rotate to carry the substrate; and
    a shuttle buffer part configured to move between the first transfer chamber and the second transfer chamber to transfer the substrate at least from the second main carrying robot to the index robot, the shuttle buffer part including,
        a first shuttle buffer configured to carry substrates to the second main carrying robot before processing, and
        a second shuttle buffer configured to move independently of the first shuttle buffer to carry substrates to the index robot after processing.

2. The apparatus of claim 1, wherein the processing part comprises:
    two or more first processing chambers stacked in a second direction; and
    two or more second processing chambers stacked in the second direction adjacent to the two or more first processing chambers such that the two or more first processing chambers and the two or more second processing chambers are sequentially arranged in the first direction, the second direction being perpendicular to the first direction.

3. The apparatus of claim 1, wherein the shuttle buffer part further comprises:
    a moving axis extending from the first transfer chamber to the second transfer chamber, the shuttle buffer part configured to move along the moving axis.

4. An apparatus configured to process a substrate, the apparatus comprising:
    a load port configured to hold a substrate transfer container accommodating the substrate;
    an index part including an index robot configured to transfer the substrate from the substrate transfer container;
    a processing part configured to receive the substrate from the indexing robot, and to process the substrate, the processing part including,
        a first transfer chamber adjacent to the index part, the first transfer chamber including a first main carrying robot configured to rotate to carry the substrate, and
        a second transfer chamber adjacent to the first transfer chamber such that the index part, the first transfer chamber and the second transfer chamber are sequentially arranged in a first direction with the first transfer chamber between the index part and the second transfer chamber, the second transfer chamber including a second main carrying robot configured to rotate to carry the substrate;
    a shuttle buffer part configured to move between the first transfer chamber and the second transfer chamber to transfer the substrate at least from the second main carrying robot to the index robot; and
    a controller configured to move the first main carrying robot out of a transfer path of the shuttle buffer part to prevent collision with the first main carrying robot while the shuttle buffer part is moving.

5. An apparatus configured to process a substrate, the apparatus comprising:
    an index part including an index robot;
    a fixed buffer in contact with the index part;
    a first processing part adjacent to the index part the first processing part having a first processing chamber including a first main carrying robot configured to rotate to carry the substrate from the fixed buffer;
    a second processing part adjacent to the first processing part such that the index part, the first processing part and the second processing part are sequentially arranged in a first direction with the first processing part between the index part and the second processing part, the second processing part having a second processing chamber including a second main carrying robot; and
    a shuttle buffer configured to transfer the substrate at least from the second main carrying robot to the index robot, the shuttle buffer including,
        a first shuttle buffer configured to carry the substrate to the second main carrying robot before processing, and
        a second shuttle buffer configured to move independently of the first shuttle buffer to carry the substrate to the index robot after processing.

6. An apparatus configured to process a substrate, the apparatus comprising:
    an index part including an index robot configured to transfer the substrate;
    a first processing part adjacent to the index part;
    a second processing part adjacent to the first processing part such that the index part, the first processing part and the second processing part are sequentially arranged in a first direction with the first processing part between the index part and the second processing part; and
    a shuttle buffer configured to directly carry the substrate, which is to be processed in the second processing part, from the index robot and to directly carry the substrate, which is processed in the second processing part, to the index robot, the shuttle buffer including,
        a first shuttle buffer configured to carry the substrate to the second processing part before processing; and
        a second shuttle buffer configured to move independently of the first shuttle buffer to carry the substrate to the index robot after processing.

7. The apparatus of claim 6, wherein the first processing part includes two or more first processing chambers stacked in a second direction, and the second processing part includes two or more second processing chambers stacked in the second direction adjacent to the two or more first processing chambers such that the two or more first processing chambers and the two or more second processing chambers are sequentially arranged in the first direction, the second direction being perpendicular to the first direction.

8. An apparatus configured to process a substrate, the apparatus comprising:

an index part including an index robot;

a fixed buffer in contact with the index part;

a first processing part adjacent to the index part the first processing part having a first processing chamber including a first main carrying robot configured to rotate to carry the substrate from the fixed buffer;

a second processing part adjacent to the first processing part such that the index part, the first processing part and the second processing part are sequentially arranged in a first direction with the first processing part between the index part and the second processing part, the second processing part having a second processing chamber including a second main carrying robot; and a shuttle buffer configured to transfer the substrate at least from the second main carrying robot to the index robot, the shuttle buffer being configured to move between a first position, to which the second main carrying robot is approachable, and a second position to that the index robot is approachable.

9. The apparatus of claim 8, wherein the first processing part includes two or more first processing chambers stacked in a second direction, and the second processing part includes two or more second processing chambers stacked in the second direction adjacent to the two or more first processing chambers such that the two or more first processing chambers and the two or more second processing chambers are sequentially arranged in the first direction, the second direction being perpendicular to the first direction.

10. The apparatus of claim 8, further comprising:

a controller configured to move the first main carrying robot out of a transfer path of the shuttle buffer to prevent collision with the first main carrying robot while the shuttle buffer is moving.

\* \* \* \* \*